(12) United States Patent
Brokken et al.

(10) Patent No.: US 9,618,739 B2
(45) Date of Patent: Apr. 11, 2017

(54) ELECTOACTIVE POLYMER ACTUATOR

(75) Inventors: Dirk Brokken, Eindhoven (NL); Floris Maria Hermansz Crompvoets, Eindhoven (NL); Hendrik De Koning, Eindhoven (NL); Wendy Mireille Martam, Eindhoven (NL); Franciscus Jacobus Vossen, Eindhoven (NL); Coen Theodorus Hubertus Fransiscus Liedenbaum, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 235 days.

(21) Appl. No.: 13/821,018

(22) PCT Filed: Sep. 2, 2011

(86) PCT No.: PCT/IB2011/053846
§ 371 (c)(1),
(2), (4) Date: Mar. 6, 2013

(87) PCT Pub. No.: WO2012/032443
PCT Pub. Date: Mar. 15, 2012

(65) Prior Publication Data
US 2013/0176608 A1    Jul. 11, 2013

(30) Foreign Application Priority Data

Sep. 9, 2010    (EP) .................................... 10175906

(51) Int. Cl.
*G02B 26/00*    (2006.01)
*G02B 26/08*    (2006.01)
(Continued)

(52) U.S. Cl.
CPC ......... *G02B 26/08* (2013.01); *G02B 26/0825* (2013.01); *G02B 26/0875* (2013.01);
(Continued)

(58) Field of Classification Search
CPC . G02B 26/0825; B81B 3/0083; B81B 3/0086; B81B 7/0009; B81B 7/0012;
(Continued)

(56) References Cited

U.S. PATENT DOCUMENTS

| 3,942,048 | A | * | 3/1976 | Laude | .................. | G02B 5/1828 |
| | | | | | | 250/237 G |
| 5,452,878 | A | * | 9/1995 | Gravesen | .................. | F15C 5/00 |
| | | | | | | 251/129.01 |

(Continued)

FOREIGN PATENT DOCUMENTS

| CN | 1732401 A | 2/2006 |
| EP | 1816493 A1 | 8/2007 |

(Continued)

OTHER PUBLICATIONS

Kornbluh et al., "Electroactive polymers: an emerging technology for MEMS," Proc. SPIE 5344, MEMS/MOEMS Components and Their Applications, 13 (Jan. 24, 2004); doi:10.1117/12.538382.*

(Continued)

*Primary Examiner* — Thomas K Pham
*Assistant Examiner* — Nicholas R Pasko

(57) ABSTRACT

An actuator comprises an electroactive polymer layer (402) and stretchable electrode structures (410, 411) that are disposed on each side of the electroactive polymer layer (402). A softer passive layer (401) is secured to one of the stretchable electrode structures (410, 411). When compressed transversally by the stretchable electrode structures (410, 411), the electroactive polymer layer (402) will expand tangentially and the actuator will relax into a shape wherein the interior of the electroded region is substantially parallel to the plane of the device, while a substantial portion of the area increase is absorbed by out-of-plane bends arising at the electrode boundary (duck mode). The invention can be (Continued)

embodied as optically reflective or refractive devices with variable geometry.

13 Claims, 3 Drawing Sheets

(51) Int. Cl.
*H01L 41/09* (2006.01)
*G02B 3/08* (2006.01)
*G02B 27/58* (2006.01)
*H01L 41/047* (2006.01)
*H01L 41/193* (2006.01)

(52) U.S. Cl.
CPC ............ *H01L 41/0986* (2013.01); *G02B 3/08* (2013.01); *G02B 27/58* (2013.01); *H01L 41/0478* (2013.01); *H01L 41/193* (2013.01)

(58) Field of Classification Search
CPC ... B81B 7/0016; B81B 7/0019; B81B 7/0022; B81B 7/0025; B81B 7/0029; H01L 41/0973
USPC ...................................... 359/224.1, 291, 295
See application file for complete search history.

(56) References Cited

U.S. PATENT DOCUMENTS

| | | | | |
|---|---|---|---|---|
| 6,376,971 | B1* | 4/2002 | Pelrine | F04B 35/00 310/363 |
| 6,930,817 | B2* | 8/2005 | Srinivasan | G02B 5/1828 359/295 |
| 7,054,054 | B1* | 5/2006 | Srinivasan | G02B 26/0825 359/295 |
| 7,292,385 | B2* | 11/2007 | Dupuis | G02B 26/0825 359/291 |
| 7,660,025 | B2* | 2/2010 | Kim | G02B 26/02 359/223.1 |
| 7,732,999 | B2* | 6/2010 | Clausen | H01L 41/083 310/328 |
| 7,787,646 | B2* | 8/2010 | Pelrine | B64C 3/48 381/176 |
| 2006/0290241 | A1* | 12/2006 | Kornbluh | A63H 13/00 446/268 |
| 2007/0200467 | A1* | 8/2007 | Heydt | H04R 19/02 310/311 |
| 2008/0289952 | A1 | 11/2008 | Pelrine et al. | |
| 2009/0310209 | A1* | 12/2009 | Aschwanden | G02B 5/1828 359/291 |
| 2009/0310221 | A1* | 12/2009 | Aschwanden | G02B 5/1828 359/573 |
| 2010/0007245 | A1* | 1/2010 | Jager | B32B 27/28 310/330 |
| 2010/0109486 | A1* | 5/2010 | Polyakov | G06F 3/0202 310/365 |
| 2010/0296294 | A1* | 11/2010 | Ackermann | G02B 26/0825 362/296.01 |
| 2011/0149410 | A1* | 6/2011 | Blum | G02B 3/14 359/666 |
| 2012/0114778 | A1* | 5/2012 | Keefe | B29C 59/02 425/135 |
| 2013/0175898 | A1* | 7/2013 | Brokken | G02B 26/0825 310/300 |
| 2013/0207793 | A1* | 8/2013 | Weaber | G06F 1/1601 340/407.2 |

FOREIGN PATENT DOCUMENTS

JP    2008292979 A    12/2008
WO    2005085930 A1    9/2005

OTHER PUBLICATIONS

Kornbluh et al., "Shape control of large lightweight mirrors with dielectric elastomer actuation," Proc. SPIE 5051, Smart Structures and Materials 2003: Electroactive Polymer Actuators and Devices (EAPAD), 143 (Jul. 28, 2003); doi:10.1117/12.484405.*
Kornbluh et al., "Electroactive polymers: an emerging technology for MEMS," Proc. SPIE 5344, MEMS/MOEMS Components and Their Applications, 13 (Jan. 24, 2004); doi:1 0.1117/12.538382.*
Prahlad et al., "Programmable surface deformation: Thickness-mode electroactive polymer actuators and their applications," Proc. SPIE 5759, Smart Structures and Materials 2005: Electroactive Polymer Actuators and Devices (EAPAD), (6 May 2005); doi: 10.1117/12.601627.*
Neogi et al., "Threshold tensile strength and modulus of carbon-black-filled rubber vulcanizates," Journal of Materials Science, vol. 25 (1990), 3524-3530.*
Nusil, CF19-2186: Medium cure rate, general purpose silicone elastomer, May 2014.*
Kornbluh et al., "Shape control of large lightweight mirrors with dielectric elastomer actuation," Proc. SPIE 5051, Smart Structures and Materials 2003: Electroactive Polymer Actuators and Devices (EAPAD), 143 (Jul. 28, 2003); doi: 10.1117/12.484405.*
Prahlad et al., "Programmable surface deformation: Thickness-mode electroactive polymer actuators and their applications," Proc. SPIE 5759, Smart Structures and Materials 2005: Electroactive Polymer Actuators and Devices (EAPAD), (May 6, 2005); doi: 10.1117/12.601627.*
Huang et al., "Electroactive polymer deformable micromirrors (EAPDM) for biomedical optics," Mat. Res. Soc. Symp. Proc. vol. 820, 2004.*
Kornbluh et al., "Electroactive polymers: an emerging technology for MEMS," Proc. SPIE 5344, MEMS/MOEMS Components and Their Applications, 13 (Jan. 24, 2004); doi: 10.1117/12.538382.*
Rosset et al., "Flexible and stretchable electrodes for dielectric elastomer actuators," Applied Physics A, 110(2), Feb. 2013, 281-307.*
F.M.H. Crompvoets et al. "Accurate Free-Form Surface Actuation Using a Non-RE-Stretched Silicone Dielectric Polymer Actuator" Electroactive Polmer Actuators and Devices (EAPAD), Mar. 7-10, 2011, San Diego, CA, USA, Proceedings of SPIE, vol. 7976. pp. 1-8.
T. Maleki et al. A Batch Fabricated Elastomeric Actuator With Large Out of Plane Displacement, 18th Biennial, University/Goverment/Industry Micro.Nano Symposium (UGIM 2010), Jun. 28, 2010-Jul. 1, 2010, West Lafayette, IN, USA, Jun. 28, 2010, pp. 1-3.
Koo Jung et al; "Development of Soft-Actuator-Based Wearable Tactile Display", IEEE Trans. Robotics, vol. 24, No. 3, Jun. 2008, pp. 549-558.
Ronald E. Pelrine et al; "Electrostriction of Polymer Dielectrics With Compliant Electrodes as a Means of Actuation", Sensors and Actuators A 64, 1998, pp. 77-85.

* cited by examiner

ELECTOACTIVE POLYMER ACTUATOR

FIELD OF THE INVENTION

The invention disclosed herein generally relates to electroactive polymer actuators. In particular, it relates to an actuator with an asymmetric layered structure allowing localized out-of-place actuation.

The invention also relates to a method of manufacturing such an actuator.

BACKGROUND OF THE INVENTION

Dielectric actuators in the form of laminates (or sandwich structures or layered materials) belong to a rapidly evolving field of technology. A simple dielectric actuator may comprise a layer of electroactive polymer and an electrode pair for applying an electrostatic force and thereby causing an elastic deformation of the polymer layer in the tangential and/or transversal direction. More sophisticated dielectric actuators may include functional additional layers, such as optically reflective or antireflective layers, texture-enhancing layers, electrically and/or thermally conductive layers, etc.

The way in which a dielectric actuator responds to an applied electric field may be influenced by the addition of passive layers. The application published as US-2008/0289952 discloses a laminate consisting of an actuator coated with one or more passive polymer layers. The passive layers respond indirectly to variations in the actuating field under the action of shearing forces exerted on them by the actuator. Thus, as shown in FIG. 1 of the present application, expansion of an active area D between the electrodes E1, E2 of the actuator stretches the passive layers PL1, PL2 so that an elevated edge, corresponding to the boundary of the active area D, is produced on an external surface TDS of the laminate TDU. (It is noted that the visible difference in size of the electrodes E1, E2 is not a feature common to all actuators of this type.) To further illustrate such stretch-mode movement, FIG. 2 shows how compression—and accompanying planar stretching—of that portion of an EAP layer 202 which is located between two electrodes 210, 211 causes an amplified thickness contraction of surrounding passive layers 210, 211 by the Poisson effect. The material making up the elevated edge is supplied from the active area by stretching the latter into a thinner shape; such stretching may not be acceptable in all applications.

Koo, Jung et al., Development of soft-actuator-based wearable tactile display, *IEEE Trans. Robotics*, vol. 24, no. 3 (June 2008), pp. 549-558 discloses a dielectric actuator, a portion of which is capable of buckling movement, as shown by FIG. 3 of the present application. The active portion 320 of the actuator 302, 310, 311 is clamped inside a rigid boundary frame (not shown), thus not in elastic contact with the surrounding portion 321. The clamping restricts tangential expansion and causes the actuator to deflect out-of-plane instead, a preferred direction of buckling being defined by the presence of a passive layer 301. While actuators of this type may achieve a relatively large deflection amplitude, they are generally unable to produce sharp edges, hence not ideal for tactile applications. Further, it has turned out that buckling-mode actuators perform best for symmetric shapes, such as square-shaped or round shapes, and will therefore not be compatible with too irregular electrode shapes.

SUMMARY OF THE INVENTION

It is an object of the present invention to overcome these limitations, and to provide an actuator with an actuation mode for producing relatively sharp edges while expanding in-plane only to a limited extent. A further object is to provide an efficient method for manufacturing such actuator.

According to a first aspect of the invention, at least one of these objects is achieved by an actuator comprising an electroactive polymer (EAP) layer and stretchable electrode structures disposed on each side of the EAP layer.

The electrode structures may have the form of flexible sheets, plates, grids, addressable matrices, addressable point arrays or the like. They are stretchable in the sense that they are at least as soft as the EAP layer. More precisely, their elastic moduli (or Young's moduli) $Y_{el,1}$, $Y_{el,2}$ are less than or substantially equal to the elastic modulus $Y_{EAP}$ of the EAP layer. (In the case of anisotropic materials, the elastic moduli for tangential/in-plane deformations are the most relevant ones.) According to the invention, the actuator further comprises a passive layer secured to one side of the actuator (i.e. to one of the stretchable electrode structures) and that is elastically deformable by being entrained by the actuator, the passive layer being mechanically uniform in all tangential directions.

The securing of the passive layer to the actuator is primarily aimed at conveying shear forces between the layers; certain materials may be joined using artificial bonding means, while adhesive forces between other combinations of materials may arise as soon as the two surfaces are brought into contact.

When the electrode structures apply a voltage across an active region of the EAP layer, the active region will compress transversally and tend to increase its area. Since one side of the actuator is secured to a mechanically uniform passive layer—this uniformity includes non-restricted expandability and contractibility in all lateral directions—the actuator will deform in a localized manner. More precisely, the deformation will be localized to the active region and its immediate surroundings, so that the interior of this region is shifted out-of-plane while maintaining an orientation substantially parallel to its original position. A zone at and around the boundary of the active region will to some extent run in the thickness direction, and will generally be oriented non-parallel to the plane of the laminate. By virtue of the bending of its boundary zone, the EAP layer under compression can relax into an equilibrium state substantially without causing its surroundings to deform; put differently, the size expansion induced by the electric field will be substantially localized to the active region and a large portion thereof is absorbed by the boundary zone's outward extension from the plane of the EAP layer. By providing an actuator with the ability to deform in this manner, referred to as duck mode deformation in what follows, the invention fulfils its first object.

Without acquiescing to a particular theoretic model, it is believed that one of the mechanisms facilitating this localized out-of-plane deformation is the fact that Maxwell stress (in all three dimensions) arises in the active region but not beyond this. Hence, sharp edges are more likely to appear if the electrode edges are well-defined. The EAP layer expands more easily towards the free electrode, which is not proximate to the passive layer, and will therefore be located on the convex side of the relaxed configuration of a laminate to which an electric field is applied.

An advantage of the invention lies in that it produces a significant vertical amplitude (deep topography) at a small energy expense. This is because, in comparison with stretch-mode actuators with a thickness enhancement layer, a smaller quantity of material is relocated. This is a consequence of the fact that the thickness enhancement layer in an actuated stretch-mode actuator is deformed into a configuration where it has smaller thickness than in the relaxed state. The two sides of the enhancement layer approach one another. In contrast, actuators according to the invention may create texture-enhancing edges by shifting a bounded region out-of-plane in substantially one single (transversal) direction; the two sides of the layer are displaced essentially parallel to one another. Thus, the invention achieves a comparable texture enhancement, at least from a tactile point of view, while operating at lower local stresses, so that the required peak voltage is lower and the life-cycle energy consumption is decreased.

Another advantage of the invention, in comparison with actuators of the type disclosed in US-2008/0289952, is that use of pre-strained actuator films is non-imperative. This simplifies the manufacture. Pre-straining favours stretch-mode deformation and accompanying formation of elevated edges rather than duck-mode deformation; for instance, pre-straining may contribute to a thickening of the EAP layer around the boundary of the active region.

Yet another advantage is that it is also not imperative to use electrodes which are stretchable in the tangential direction, for in duck mode, the edges are created by a portion of the passive layer dropping down, not by stretching the passive layer tangentially. This provides the designer with a greater freedom; in particular, since the electrode may then be provided as stable, substantially non-stretching surfaces, reflective surface can be arranged directly onto the actuator.

The size expansion is normally more localized for actuator materials with smaller bending stiffness, that is, smaller shear modulus and thickness. It is understood that the one-sidedness of the passive coating is no essential element of the invention and no absolute requirement for the occurrence of duck-mode behaviour. Rather, this is achieved by the presence of an asymmetry in the overall structure of the laminate. For instance, a similar behaviour may be expected in an actuator surrounded by double passive layers if one of these is relatively more yielding in the transversal direction and thus suited to accommodate the active region that tends to shift into it. In contrast hereto, devices for stretch-mode actuation with texture enhancement often feature double passive layers with similar mechanical properties arranged on each side of the actuator core; thus, by ensuring a substantially symmetric stiffness gradient over the thickness of the device, bending deflections are avoided.

In a second aspect, the invention provides a method for manufacturing an actuator according to the first aspect. By the method, the actuator to be produced is conceptually divided into two or more sub-laminates to be produced separately. Each sub-laminate comprises one or more layers and is provided by separate—and possibly parallel—procedures, either by direct manufacture or by obtaining prefabricated materials. After preparation of the sub-laminates, the latter are laminated together to form the actuator. The laminations may take place by mechanical compression, chemical bonding, thermal or acoustic soldering, use of unaided adhesion of surfaces (such as by van der Waals' forces) or some other lamination method known per se in the art. With reference to the second object of the invention, this method improves efficiency particularly if at least one of the sub-laminates includes a plurality of bonded layers, comprises a temperature-treated or radiation-treated constituent, a thermally or chemically hardened composition, a pre-stretched layer, a layer manufactured by coating a pre-stretched substrate, or any other constituent manufactured in a time-consuming manner or requiring to be manufactured physically separated from at least one other manufacturing step to avoid contamination.

In one embodiment, an actuator comprises an EAP layer, stretchable electrode structures disposed on each side and a passive layer secured directly to one of the stretchable electrode structures of the actuator. Thus, only one of the electrode structures is interposed between the EAP layer and the passive layer. This allows the actuator to deform in duck mode as desired. As noted above, the buckling mode would be furthered if the tangential expandability of the passive layer and/or the actuator were constrained by stiff or rigid elements present in the actuator.

In one embodiment, the passive layer is thicker than the EAP layer. Actuators with such design have proved to deform in duck mode.

In one embodiment, the passive layer is softer than the EAP layer. Put differently, the elastic modulus $Y_p$ of the passive layer is smaller than the elastic modulus $Y_{EAP}$ of the EAP layer. The ratio $Y_p/Y_{EAP}$ is at most 1.1, such as at most 1, such as at most 0.75, such as at most 0.5, such as at most 0.25, such as at most 0.1. This embodiment may be combined with the preceding one to advantage, so as to achieve pronounced duck-mode behaviour at actuation.

In one embodiment, the passive layer has a tangential elastic modulus of at most 0.5 MPa, preferably at most 0.4 MPa and most preferably about 0.3 MPa. This embodiment has proved to deform in duck mode.

In one embodiment, the passive layer has a top layer with a tangential elastic modulus of several GPa's and a thickness of 1.5 microns. This embodiment has proved to deform in duck mode.

In one embodiment, the EAP layer comprises a composition containing at least one material chosen from the following list:
  acrylic,
  poly[styrene-b-(ethylene-co-butylene)-b-styrene],
  polyurethane,
  polyvinyl chloride,
  silicone, e.g., silicone rubber.

These materials have demonstrated advantageous properties as EAP materials. For one thing, they have Poisson ratios equal to or close to 0.5, which ensures near-incompressible behaviour, by which tangential contraction takes place jointly with transversal expansion and vice versa. In particular, they have experimentally been found to behave in duck mode when combined with a passive layer as in the embodiments previously mentioned.

Adjustable reflectors form a further group of embodiments, which can be readily combined with features from the embodiment already outlined. In one such embodiment, the passive layer has an optically reflective external surface. The reflective surface is adapted to reflect electromagnetic radiation in a predetermined wavelength range. Suitably, the reflective surface is substantially smooth for measuring or imaging purposes, while a rougher surface may be adequate if the reflector serves the "non-imaging optics" purpose of beam steering, beam shaping, redirecting heat radiation, concentrating light for illumination etc. The geometry of the reflector is adjustable by varying the voltage applied between the electrodes of the laminate, which means that such reflector is functionally equivalent to several fixed reflectors. In particular, the angle of the reflecting surface can be adjusted so that the geometry of reflected rays—particularly their direction of propagation—can be controlled. Adjustable reflectors of this kind may have a curved shape already in their relaxed state, by virtue of a passive layer with uneven thickness, e.g., forming a concavely shaped top surface, such as a spherical or parabolic surface.

The reflective external surface can be provided by coating (such as by vapour deposition), by direct dyeing of the passive layer (such as by admixture of reflective particles) or by securing a sheet of reflective material onto the passive layer. The sheet of reflective material, when applicable, is preferably polymeric. It may be a metalized polyester film, such as metalized polyethylene terephthalate. In particular, aluminium-coated Mylar® or Steinerfilm® may be used. Suitably, a reflective layer disposed on top of the passive layer has a limited influence on the mechanical properties of the passive layer. For instance, the reflective layer is compliant to bending, so as not to restrict duck-mode behaviour.

In one embodiment, an adjustable reflector is arranged on a textured pattern provided in the passive layer of an actuator, so that a textured reflector is realised. By actuation of the actuator, the geometry of the reflector and consequently the textured pattern can be changed. Further, the geometry of the electrode structure may allow the reflector to switch between a non-actuated, smooth shape and an actuated, textured shape. For example, a grid-shaped electrode structure may give rise to an array of square-shaped dents on the reflector.

Transparent, and possibly refractive, actuators form yet another group of embodiments, in which the actuator comprises at least one transparent portion admitting a predetermined wavelength range. The actuator may be completely transparent or may have a dedicated transparent region. By actuation of the actuator, the passive layer deforms to obtain modified optical properties, including attenuation, location of cardinal points of a refractive region, focal length of a refractive region, polarisation, and scattering.

In one embodiment, the passive layer comprises a refractive pattern or structure. The refractive pattern may be a three-dimensional pattern executed directly in the passive layer. It may also be a three-dimensional refractive body attached on top of the passive layer, the refractive body having possibly a refractive index different than that of the passive layer. In particular, the refractive body may be a lens, such as a spherical or Fresnel-type lens.

When one of the materials mentioned previously is used, a suitable thickness of the passive layer may lie in the range from 10 μm to 5 mm, and preferably does not exceed 1 mm.

It is noted that the invention relates to all possible combinations of features recited in the claims.

BRIEF DESCRIPTION OF THE DRAWINGS

This and other aspects of the present invention will now be described in more detail, with reference to the appended drawings showing embodiments of the invention, on which.

It is pointed out that the figures are generally not to scale. Unless otherwise indicated, the upward and downward directions on a drawing are not necessarily aligned with the gravitational field.

DETAILED DESCRIPTION OF THE EMBODIMENTS

Figure 1:
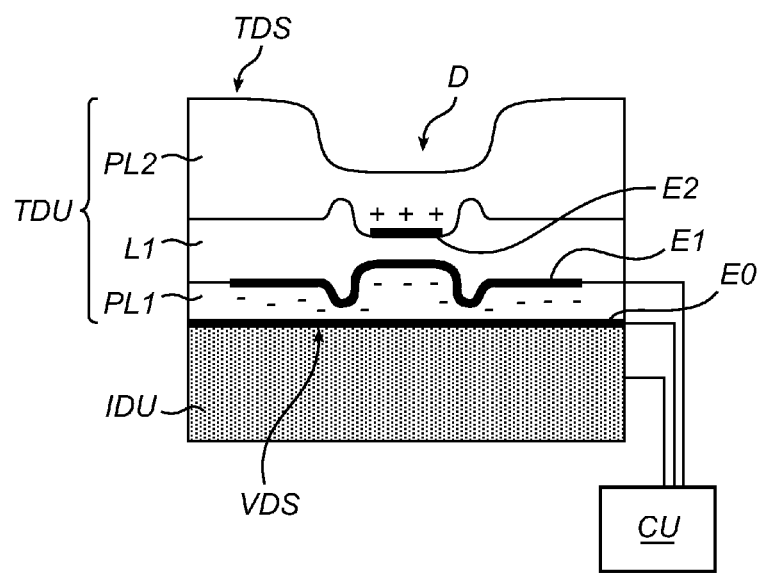
FIGS. 1 and 2 show available actuators with passive layers for movement in a stretch mode.
Figure 2:
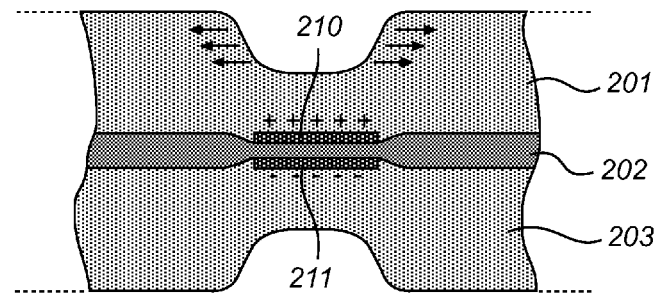
Figure 3:
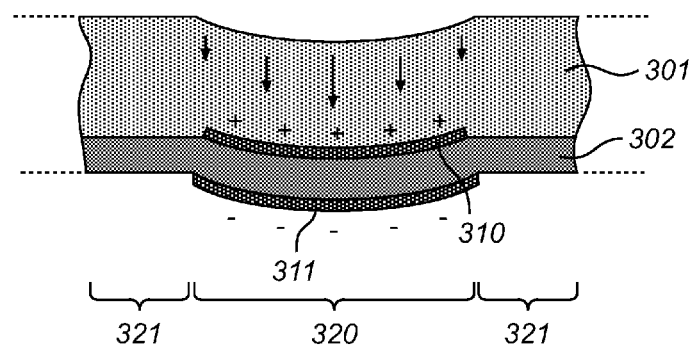
FIG. 3 shows an available actuator with passive layer and a portion of restrained tangential expandability, for movement in a buckling mode.
Figure 4:
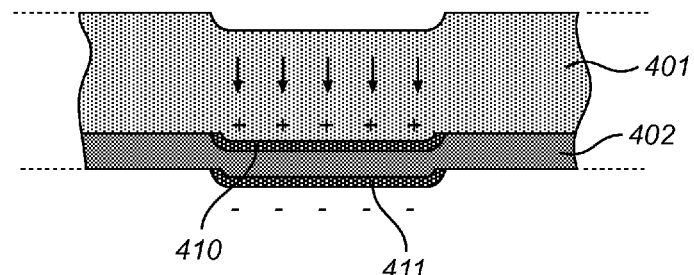
FIG. 4 shows an actuator according to an embodiment of the invention, wherein an enhancement layer for movement in a duck mode is provided.

FIG. 4 is a cross-sectional view of an actuator according to an embodiment of the present invention. On each side of an electroactive polymer (EAP) layer 402, with characteristics discussed in previous sections, are disposed a first 410 and a second 411 electrode grid for applying an electric field across the EAP layer 402. Suitable electrode materials include carbon black, single- or double-walled carbon nanotubes, graphene and soft metals. In applications where transparency is required, e.g., optical devices, the electrodes may be made of graphene, polyaniline (PANI) or poly(3,4-ethylenedioxythiophene) (PEDOT). The electrodes 410, 411 and the EAP layer 402 can be said to form the actuator core. The actuator further comprises a passive layer 401 secured to the first electrode grid 410, particularly in order to be acted on by shear forces exerted by the top side of the actuator core. The actuator is shown in an actuated state, in which a non-zero electric field induces a deformation of the EAP layer 402 into reduced thickness and, by incompressibility, into greater surface area. The actuator then relaxes into the shape shown on the drawing, wherein a portion of the surface-area increase is absorbed by the boundary zone's outward extension from the plane of the EAP layer 402. Notable are the relatively sharp corners along the boundary zone of the active region (as defined by the location of the electrode grids), which corners give rise to an embossed pattern on the top surface of the passive layer 402.

Figure 5:
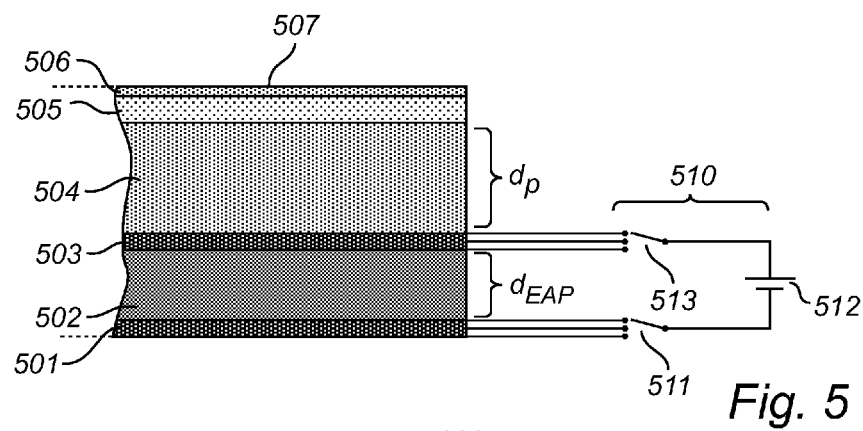
FIG. 5 shows an actuator according to another embodiment of the invention, wherein a reflective top layer is bonded to the passive layer by an intermediate layer.

FIG. 5 is a cross-sectional view of a further embodiment of the actuator according to the invention. An EAP layer 502 is equipped with addressable electrode structures 501 and 503 disposed on each side and connected to a power unit 510. The electrodes structures 501 and 503 may be formed by tongue-shaped elements (not shown) which are separately connectable by respective switches 511 and 513 to either pole of a voltage source 512. In practical circumstances, voltages in the range from 150 V to 4000 V may be applied to the electrodes. The tongue-shaped elements of the respective electrodes 501 and 503 may be arranged with perpendicular orientations, so that the area where (projections of) any two tongues intersect can be energized by setting the switches 511 and 513 in corresponding positions. The actuator shown in FIG. 5 further comprises a passive layer 504, a bonding layer 505 and a reflective coating 506, so that the top surface 507 may serve as a reflector with adjustable shape.

Figure 6:
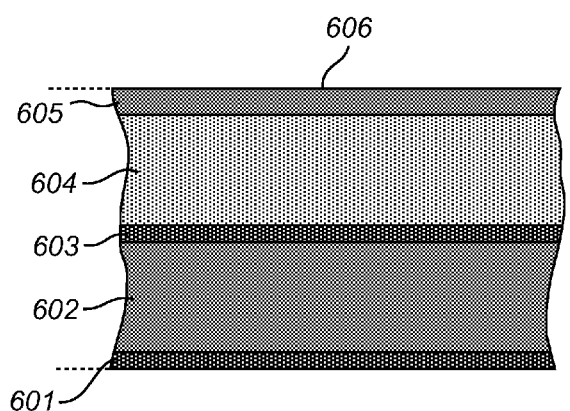
FIG. 6 shows an actuator according to yet another embodiment of the invention, wherein a reflective top layer is disposed on the passive layer.

FIG. 6 is a cross-sectional view of an actuator with several features in common with the actuator of FIG. 5. One difference lies in that a reflective surface 606 is formed by a reflective film 605 secured onto the passive layer 604. The film, which is preferably pre-fabricated in a different process, is a thin, compliant polymer foil. The foil is either metal-coated or contains reflective particles. The thickness may for example be 1.5 μm. As already mentioned, foils sold under the trademark Mylar® or Steinerfilm® at the date of filing this application may be used for this purpose. It is noted that foils of both these kinds bond well to Silastic® without a dedicated bonding agent. Also, in another embodiment, these kinds of foils can be directly attached to the EAP layer 602, also triggering duck-mode.

Figure 7:
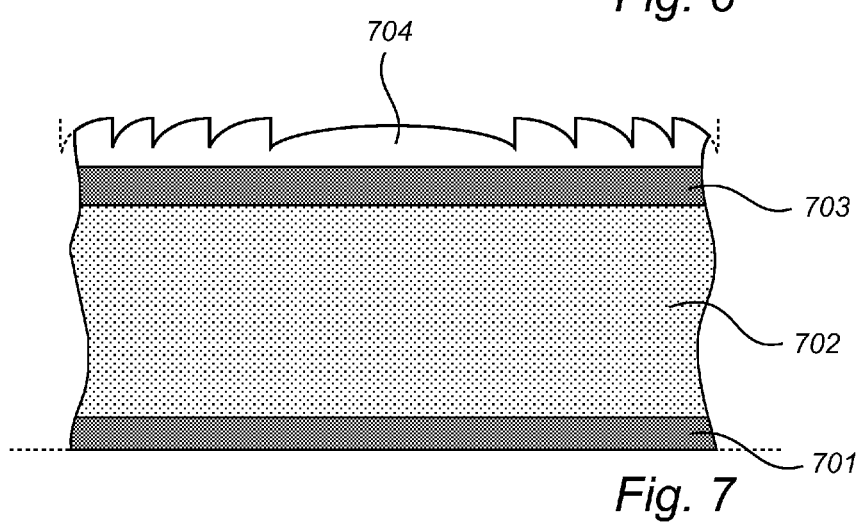
FIG. 7 shows a refractive actuator with variable optical properties, according to still another embodiment of the invention.

Finally, the invention may be embodied as an actuator consisting of transparent layers. FIG. 7 is a cross-sectional view of a refractive actuator suitable for optical applications. To this effect, the EAP layer 702 consists of a non-pre-stretched Dow Corning Nusil® 2186 film. Electrodes 701 and 703 are made from PEDOT:PSS (poly(3,4-ethylenedioxythiophene) poly(styrenesulfonate)) painted on the EAP layer 702, wherein wetting may be supported by an appropriate surfactant. A modular Fresnel-type lens structure 704 is made separately by drop-casting Dow Corning Nusil® 2186 on a suitable mould and is then secured to the rest of the actuator. The geometry of the lens structure 704 can be varied by applying electric voltages over portions of the actuator causing it to deform locally, especially in the (boundary) areas between active and passive areas.

The person skilled in the art realizes that the present invention by no means is limited to the preferred embodiments described above. On the contrary, many modifications and variations are possible within the scope of the appended claims. For example, the embodiments disclosed in this application may be varied by substituting materials or adding further layers and may nevertheless exhibit a duck-mode-like behaviour when energized.

EXAMPLE

Without being limited thereto, the invention will be illustrated by an example concerning an actuator of the type shown in FIG. 5.

First, an 80 µm thick film of Nusil® CF 2186 was fabricated using for instance doctor blading of the freshly mixed components onto an anti-adhesive plate, such as a Teflon® plate. This layer, which would form the EAP layer of the laminate, was cured at 60° C. for one hour. Next, a stretchable electrode was made on top of the Nusil® layer by screen printing carbon black (e.g., Monarch® 1000) in n-heptane through a patterned screen. Subsequently, a thicker, softer polymer (e.g., Silastic®) was casted or doctor-bladed over the EAP layer and electrode. After polymerization (in air, for Silastic®), this formed a passive layer acting as texture enhancement layer with a lower elastic modulus than the actuation layer: Silastic® has a modulus of about 0.3 MPa, while Nusil® has a modulus of about 1 MPa. For tactile applications, the thickness of this layer was preferably 100 µm to 5 mm. For optical applications, where a greater degree of compliance may be advantageous, it was chosen between 0.1 µm and 1 mm. Finally, to generate a reflective surface, vapour deposition of chromium (15 nm) and then aluminium (160 nm) was effected. The chromium layer was to act as a bonding layer between the soft passive layer and the reflective aluminium.

The actuator fabricated by this method behaved in duck mode, which was believed to be caused by the asymmetry of the laminate. In an active region, where an electric field was applied, the surface of the actuator would duck up to 200 µm below the top plane of the actuator (as defined by, e.g., the non-active regions). The actuation took place in well-defined areas. It was observed that the actuator responded swiftly to an applied electric field: it was possible to carry out 1 000 work cycles per second.

The above example can be varied with respect to:
the thickness of the EAP layer: to limit the necessary driving voltage, a thickness $d_p$ below 200 µm is generally preferable; it may also be $d_p$ substantially equal to or smaller than 80 µm or $d_p$ substantially equal to or smaller than 40 µm;

the choice of EAP material: alternatives are acrylics (such as 3M™ VHB™ 4905 or 4910), polyurethanes, polyvinyl chloride and several silicone rubbers (such as Wacker Elastosil® RT625, Dow Corning WL3010, WL5331, HS3, Sylgard® 186, 184);

the forming of the electrodes: alternatives include applying 'dry' carbon-black particles adhering to a suitably patterned polydimethylsiloxane stamp, or using metallic (and possibly ion-implanted) materials to generate electrode systems of various stretchable geometries, such as flat, corrugated, patterned or perforated; and the choice of reflective materials: instead of aluminium, noble metals can be used as reflective metal, and chromium can be replaced by a layer of a metal with similar elastic and/or adhesive properties.

The invention claimed is:

1. An actuator extending in a first plane in a non-actuated state comprising:
    an electroactive polymer layer,
    stretchable electrode structures disposed on each side of the electroactive polymer layer, and
    a passive layer secured to one of the stretchable electrode structures,
    wherein the stretchable electrode structures have elastic moduli $Y_{el,1}, Y_{el,2}$, in a corresponding tangential direction, that are less than or substantially equal to an elastic modulus $Y_{EAP}$ of the electroactive polymer layer in the corresponding tangential direction,
    wherein the passive layer is elastically deformable by entrainment of the actuator, mechanically uniform in all tangential directions, and has an optically reflective external surface that is textured, is distinct from said electrode structures and is arranged on a textured pattern present in the passive layer, wherein at least one geometric property of the textured pattern is variable by deformation of the passive layer;
    wherein a boundary having a first length of each of the stretchable electrode structures bend with an adjacent portion of the electroactive polymer layer in a sandwiched relation in a same first direction non-parallel to the first plane when the actuator is in an actuated state, and wherein a portion of each stretchable electrode structure in between the boundary of each stretchable electrode structure having a second length that is longer than the first length and is parallel to the first plane in an actuated state; and
    wherein the electroactive polymer layer in between the boundary of each stretchable electrode structure has a first thickness in an unactuated state and a second thickness in the actuated state, wherein the second thickness is substantially the same as the first thickness.

2. The actuator of claim 1, wherein the passive layer is secured directly to one of the stretchable electrode structures.

3. The actuator of claim 1, wherein a thickness $d_p$ of the passive layer is greater than or substantially equal to a thickness $d_{eap}$ of the electroactive polymer layer.

4. The actuator of claim 1, wherein a ratio $Y_p/Y_{EAp}$ of an elastic modulus $Y_p$ of the passive layer in the corresponding tangential direction and the elastic modulus $Y_{EAP}$ of the electroactive polymer layer is at most 1.1.

5. The actuator of claim 1, wherein the passive layer has an elastic modulus $Y_p$ in the corresponding tangential direction of at most 0.5 MPa.

6. The actuator of claim 1, wherein the electroactive polymer layer comprises a material selected from the group consisting of acrylic, poly[styrene-b-(ethylene-co-butylene)-b-styrene], polyurethane, polyvinyl chloride, and silicone.

7. The actuator of claim 1, wherein the optically reflective surface is formed by at least one metallized polymer film secured to the passive layer.

8. The actuator of claim 1, comprising an optically transparent portion, wherein at least one optical property of the passive layer is variable by deformation of the passive layer.

9. The actuator of claim 1, wherein a thickness $d_p$ of the passive layer is between 10 μm and 5 mm.

10. The actuator of claim 1, wherein the textured pattern is present in the passive layer when the actuator is in a non-actuated state.

11. The actuator of claim 7, wherein the passive layer comprises an optically transparent portion that is delimited by a non-transparent portion, thereby defining a variable optical apodizer.

12. The actuator of claim 8, wherein said at least one optical property is selected from the group consisting of: attenuation, location of cardinal points, focal length, polarization, and scattering.

13. The actuator of claim 7, wherein the passive layer comprises an optically refractive pattern.

* * * * *